(12) United States Patent
Son

(10) Patent No.: US 10,747,661 B2
(45) Date of Patent: *Aug. 18, 2020

(54) DATA STORAGE DEVICE AND OPERATING METHOD THEREOF

(71) Applicant: SK hynix Inc., Gyeonggi-do (KR)

(72) Inventor: Ik Joon Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 72 days.

This patent is subject to a terminal disclaimer.

(21) Appl. No.: 16/057,070

(22) Filed: Aug. 7, 2018

(65) Prior Publication Data

US 2018/0341583 A1 Nov. 29, 2018

Related U.S. Application Data

(63) Continuation-in-part of application No. 15/217,510, filed on Jul. 22, 2016, now Pat. No. 10,073,642.

(30) Foreign Application Priority Data

Jan. 19, 2016 (KR) .................. 10-2016-0006360

(51) Int. Cl.
*G06F 12/02* (2006.01)
*G11C 16/26* (2006.01)
(Continued)

(52) U.S. Cl.
CPC .......... *G06F 12/0246* (2013.01); *G06F 3/061* (2013.01); *G06F 3/064* (2013.01); *G06F 3/0604* (2013.01); *G06F 3/0634* (2013.01); *G06F 3/0652* (2013.01); *G06F 3/0659* (2013.01); *G06F 3/0679* (2013.01); *G11C 16/26* (2013.01);
(Continued)

(58) Field of Classification Search
CPC ............. G06F 3/0679; G06F 12/0246; G06F 2212/7208; G06F 3/0659; G06F 2212/7205; G06F 3/061; G06F 3/064; G06F 3/0652; G06F 3/0634; G06F 2212/1041; G06F 2212/7202; G06F 3/0604; G11C 16/26; G11C 16/349; G11C 16/34

See application file for complete search history.

(56) References Cited

U.S. PATENT DOCUMENTS

| 9,240,245 B1* | 1/2016 | Bellorado ......... G11C 16/3422 |
| 2014/0136884 A1* | 5/2014 | Werner ............... G06F 11/2094 |
| | | 714/6.11 |
| 2016/0124679 A1* | 5/2016 | Huang ................. G06F 3/0647 |
| | | 711/103 |

* cited by examiner

*Primary Examiner* — Hashem Farrokh
(74) *Attorney, Agent, or Firm* — IP & T Group LLP

(57) ABSTRACT

A method for operating a data storage device including memory regions each including memory units of levels, the levels respectively corresponding to bitmaps, and each of the bitmaps including entries respectively corresponding to the memory regions includes controlling a read operation for a first memory unit of a first level among the levels in a first memory region among the memory regions; increasing a read count by checking a first entry corresponding to the first memory region in a first bit map corresponding to the first level, wherein each of entries included in the first bitmap reflects whether a corresponding memory region is included in at least one second memory region in which a memory unit of the first level has been read, during a predetermined period before the read operation for the first memory unit; and performing a management operation for the memory regions, based on the read count.

18 Claims, 14 Drawing Sheets

(51) Int. Cl.
*G06F 3/06* (2006.01)
*G11C 16/34* (2006.01)
(52) U.S. Cl.
CPC .... *G11C 16/349* (2013.01); *G06F 2212/1041* (2013.01); *G06F 2212/7202* (2013.01); *G06F 2212/7205* (2013.01); *G06F 2212/7208* (2013.01)

DATA STORAGE DEVICE AND OPERATING METHOD THEREOF

CROSS-REFERENCES TO RELATED APPLICATION

The present application is a continuation-in-part application of U.S. application Ser. No. 15/217,510, filed on Jul. 22, 2016, which claims priority under 35 U.S.C. § 119(a) to Korean application number 10-2016-0006360, filed on Jan. 19, 2016. The disclosure of each of the foregoing applications is incorporated herein by reference in its entirety.

BACKGROUND

1. Technical Field

Various embodiments generally relate to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a method for operating a data storage device including a plurality of memory regions, each of the plurality of memory regions including memory units of a plurality of levels, the plurality of levels respectively corresponding to a plurality of bitmaps, and each of the bitmaps including a plurality of entries respectively corresponding to the plurality of memory regions may include: controlling a read operation for a first memory unit of a first level among the levels in a first memory region among the memory regions; increasing a read count by checking a first entry corresponding to the first memory region in a first bit map corresponding to the first level among the bitmaps, wherein each of a plurality of entries included in the first bitmap reflects whether a corresponding memory region is included in at least one second memory region in which a memory unit of the first level has been read, during a predetermined period before the read operation for the first memory unit; and performing a management operation for the plurality of memory regions, based on the read count.

In an embodiment, a data storage device including a nonvolatile memory device including a plurality of memory regions; and a controller suitable for performing a read operation for a first memory region, increasing a read count based on read sequences of the first memory region and a second memory region which has been read before the read operation for the first memory region, and performing a management operation for the plurality of memory regions based on the read count, wherein the controller does not increase the read count when a read sequence of the second memory region and a read sequence of the first memory region are in sequence.

In an embodiment, a data storage device including a nonvolatile memory device including a plurality of memory regions; and a controller suitable for performing a read operation for a first memory region, increasing a read count by checking a first entry of the first memory region in a bitmap which includes entries corresponding to the plurality of memory regions respectively, a state of each of the entries reflecting whether a corresponding memory region is included in at least one second memory region which has been read during a predetermined period before the read operation for the first memory region, and performing a management operation for the plurality of memory regions based on the read count.

DETAILED DESCRIPTION

Figure 1:
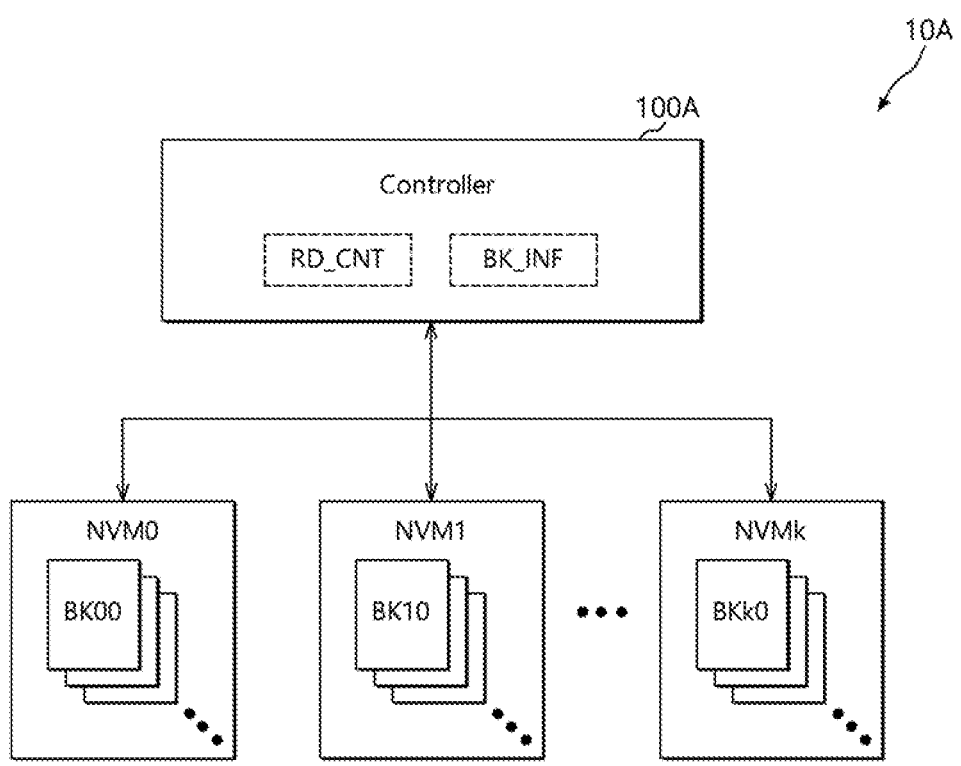
FIG. 1 is a block diagram illustrating a data storage device in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

FIG. 1 is a block diagram illustrating a data storage device 10A in accordance with an embodiment.

The data storage device 10A may be configured to store data provided from an external device (not shown) in response to a write request from the external device. Additionally, the data storage device 10A may be configured to provide stored data to the external device in response to a read request from the external device.

The data storage device 10A may be configured by a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device 10A may include a controller 100A and a plurality of nonvolatile memory devices NVM0 to NVMk.

The controller 100A may control the general operations of the data storage device 10A. The controller 100A may store data in the nonvolatile memory devices NVM0 to NVMk in response to a write request transmitted from the external device, and may read data stored in the nonvolatile memory devices NVM0 to NVMk and output the read data to the external device in response to a read request transmitted from the external device.

The controller 100A may manage a plurality of memory regions of the nonvolatile memory devices NVM0 to NVMk based on a predetermined sequence. The predetermined sequence may be a sequence in which sequential read operations are performed for the plurality of memory regions, that is, a sequential read sequence. The plurality of memory regions according to the sequential read sequence may be corresponding to successive addresses, and may be accessed according to the sequential read sequence when the sequential read operations are performed. The plurality of memory regions managed based on the sequential read sequence may be grouped as a memory group. The memory regions grouped as the memory group may be included in one or more of the nonvolatile memory devices NVM0 to NVMk.

Data stored in memory regions may be influenced by read disturbance each time a read operation is performed for each of the memory regions, and may be damaged resultantly when the read operation is excessively performed. Therefore, as will be described below, the controller 100A may manage a read count RD_CNT, and perform a read reclaim operation each time the read count RD_CNT reaches a threshold count, thereby recovering damaged data.

The controller 100A may control a read operation of a nonvolatile memory device for a first memory region of the memory group, selectively increase the read count RD_CNT based on a turn (or read sequence) of a second memory region which has been previously finally read and a read sequence of the first memory region, in the sequential read sequence, and perform a management operation for the memory group based on the read count RD_CNT. The controller 100A may not increase the read count RD_CNT when the read sequence of the first memory region is later than the read sequence of the second memory region in the sequential read sequence (i.e., when the read sequence of the second memory region and the read sequence of the first memory region are in sequence (e.g., a sequence of ascending order or descending order). The controller 100A may increase the read count RD_CNT when the read sequence of the first memory region is earlier than the read sequence of the second memory region in the sequential read sequence or when the read sequence of the first memory region corresponds to the read sequence of the second memory region, that is, when the first memory region and the second memory region correspond (i.e., when the read sequence of the second memory region and the read sequence of the first memory region are out of sequence (e.g., a sequence of ascending order or descending order)). That is, the controller 100A may selectively increase the read count RD_CNT based on numbers of the first and second memory regions, in the predetermined sequence. For example, the lowest memory region such as, BK0 in FIGS. 2, 3A and 3B has the minimum number and the greatest memory region such as, BK7 in FIGS. 2, 3A and 3B has the maximum number. If the number of the first memory region which is currently read is greater than the number of the second memory region which has been read previously, the controller 100A may not increase the read count RD_CNT. In contrast, if the number of the first memory region is equal to or less than the number of the second memory region, the controller 100A may increase the read count RD_CNT.

Furthermore, the controller 100A may compare the read sequence of the second memory region and the read sequence of the first memory region based on a reference information BK_INF stored for the second memory region which has been previously finally read, and increase the read count RD_CNT according to a comparison result. Further, the controller 100A may update the reference information BK_INF with information on the first memory region, regardless of whether the read count RD_CNT is increased or not.

The controller 100A may manage the read count RD_CNT and the reference information BK_INF corresponding to the memory group. The reference information BK_INF may include information on a memory region which has been previously finally read in the memory group. When the controller 100A controls a plurality of memory groups, the controller 100A may manage a read count RD_CNT and a reference information BK_INF corresponding to each of the memory groups. The controller 100A may back up the read count RD_CNT and the reference information BK_INF in a nonvolatile memory device, then read and manage the read count RD_CNT and the reference information BK_INF as needed for example, upon booting.

The controller 100A may determine whether the read count RD_CNT reaches a threshold count, perform a scan operation for the plurality of memory regions according to a determination result, and perform the read reclaim operation for the plurality of memory regions according to a result of performing the scan operation. The controller 100A may perform the scan operation by reading data stored in the plurality of memory regions and checking error rates for the data. When the checked error rate exceeds a threshold error rate, the controller 100A may perform the read reclaim operation by performing an error correction operation for the data read from the plurality of memory regions and store error-corrected data in other positions.

According to the embodiment, the controller 100A may determine whether the read count RD_CNT reaches a threshold count, and perform the read reclaim operation for the plurality of memory regions according to a determination result while omitting the scan operation for the plurality of memory regions.

The controller 100A may decrease the read count RD_CNT when it has performed the management operation. Since the controller 100A has checked a state of the data stored in the memory regions through the management operation, the controller 100A may reset the read count RD_CNT or decrease the read count RD_CNT by a predetermined value to defer a next read reclaim operation.

The memory regions may be, for example, memory blocks. However, the embodiment is not limited to such. Each memory block may include a plurality of pages, and a read operation for the memory block may be performed to read data stored in the pages.

According to the embodiment, the read count RD_CNT which triggers the read reclaim operation is managed by the unit of a memory group and is selectively increased with regard to a read operation for a memory group, whereby it is possible to suppress the read reclaim operation from being unnecessarily performed.

Each of the nonvolatile memory devices NVM0 to NVMk may store data transmitted from the controller 100A and may read stored data and transmit read data to the controller 100A, according to control of the controller 100A. The nonvolatile memory devices NVM0 to NVMk may include pluralities of memory blocks BK00 to BKk0.

The nonvolatile memory device may include flash memory, such as NAND flash or NOR flash, Ferroelectrics Random Access Memory (FeRAM), Phase-Change Random Access Memory (PCRAM), Magnetoresistive Random Access Memory (MRAM), Resistive Random Access Memory (ReRAM), and the like.

Figure 2:
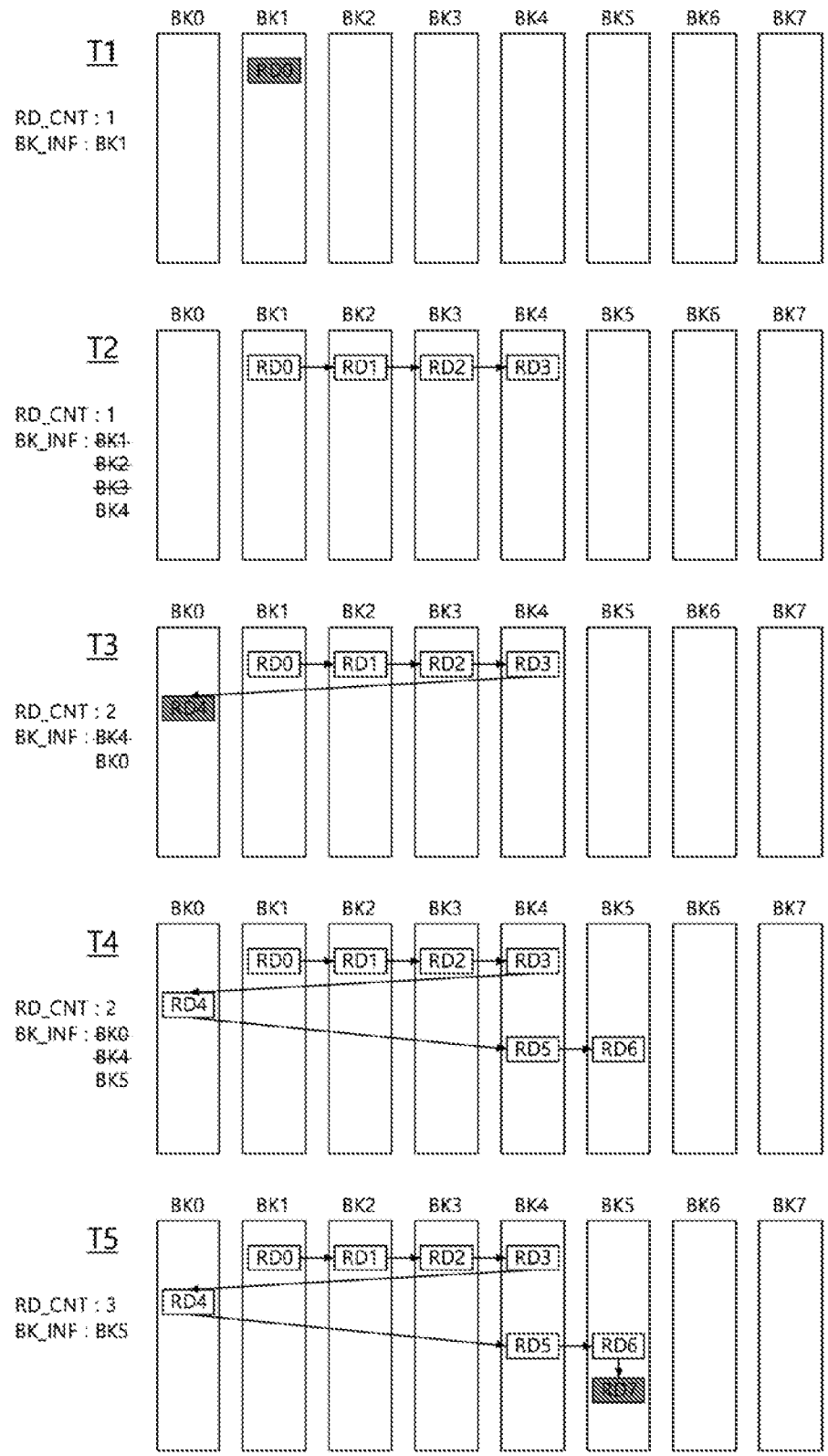
FIG. 2 is a representation illustrating a method for a controller to manage a read count and a reference information.

FIG. 2 is a diagram illustrating a method for a controller to manage a read count and a reference information. For example, the method of FIG. 2 may be the method for the controller 100A of FIG. 1 to manage a read count RD_CNT and a reference information BK_INF. Referring to FIG. 2, there are shown memory blocks BK0 to BK7 which are grouped as a single memory group and are arranged according to a sequential read sequence. Although FIG. 2 shows an example in which 8 memory blocks BK0 to BK7 are grouped, the number of memory blocks grouped according to the embodiment is not specifically limited.

While read operations RD0 to RD7 are performed, the read count RD_CNT may be selectively increased. In FIG. 2, the read count RD_CNT may be increased when the shaded processed read operations RD0, RD4 and RD7 are performed.

First, at a time T1, the controller 100A may control the read operation RD0 for the memory block BK1. The controller 100A may increase the read count RD_CNT to "1," and store information regarding the memory block BK1 as the reference information BK_INF.

At a time T2, the controller 100A may control the sequential read operations RD1 to RD3 for the memory blocks BK2 to BK4. When controlling the read operation RD1 for the memory block BK2, the controller 100A may not increase the read count RD_CNT since the read sequence of the memory block BK2 is later than the read sequence of the memory block BK1 which has been previously finally read in the sequential read sequence. The controller 100A may refer to the reference information BK_INF to identify the memory block BK1 which has been previously finally read. The controller 100A may update the reference information BK_INF with information regarding the memory block BK2.

Even when controlling the read operations RD2 and RD3 for the memory blocks BK3 and BK4, the controller 100A may not increase the read count RD_CNT by referring to the reference information BK_INF. The controller 100A updates the reference information BK_INF with information regarding the memory block BK4.

At a time T3, the controller 100A may control the read operation RD4 for the memory block BK0. The controller 100A may increase the read count RD_CNT to "2" since the read sequence of the memory block BK0 is earlier than the read sequence of the memory block BK4 which has been previously finally read in the sequential read sequence. The controller 100A may update the reference information BK_INF with information regarding the memory block BK0.

At a time T4, the controller 100A may control the sequential read operations RD5 and RD6 for the memory blocks BK4 and BK5. When controlling the read operation RD5 for the memory block BK4, the controller 100A may not increase the read count RD_CNT since the read sequence of the memory block BK4 is later than the read sequence of the memory block BK0 which has been previously finally read in the sequential read sequence. The controller 100A may update the reference information BK_INF with information regarding the memory block BK4.

Even when controlling the read operation RD6 for the memory block BK5, the controller 100A may not increase the read count RD_CNT by referring to the reference information BK_INF. The controller 100A updates the reference information BK_INF with information regarding the memory block BK5.

At a time T5, the controller 100A may control the read operation RD7 for the memory block BK5. The controller 100A may increase the read count RD_CNT to "3" since the memory block BK5 which is currently read corresponds to the memory block BK5 which has been previously finally read. The controller 100A may retain the reference information BK_INF, as the information regarding the memory block BK5.

Figure 3A:
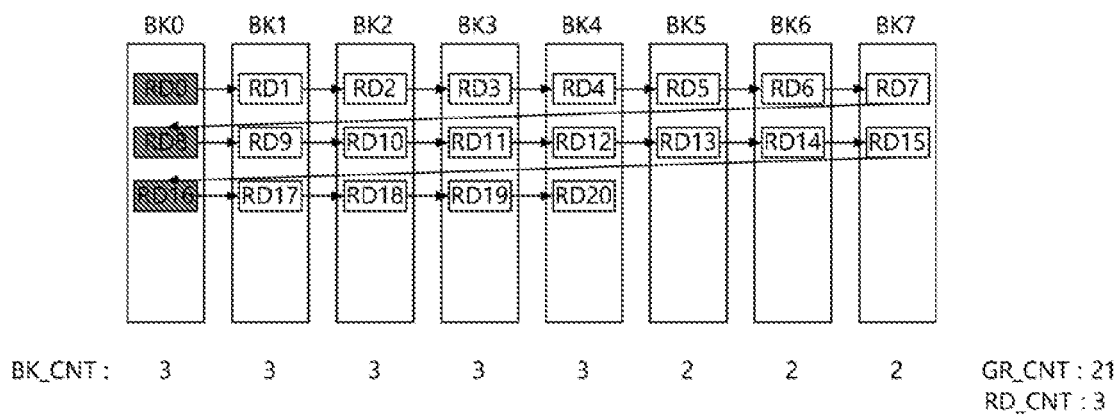
FIGS. 3A and 3B are diagrams that compare a block count, a group count and a read count.
Figure 3B:
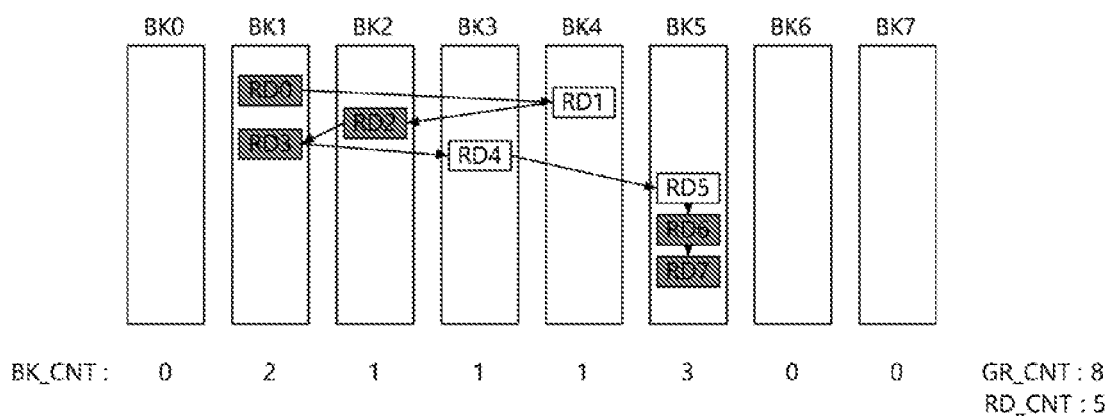

FIGS. 3A and 3B are diagrams that compare a block count BK_CNT, a group count GR_CNT and a read count RD_CNT.

Referring to FIG. 3A, when sequential read operations RD0 to RD20 are successively performed for memory blocks BK0 to BK7, a block count BK_CNT, a group count GR_CNT and a read count RD_CNT may be counted as shown.

The block count BK_CNT may be managed by the unit of a memory block, and be increased each time a read operation is performed in each of the memory blocks BK0 to BK7.

The group count GR_CNT may be managed by the unit of a memory group, and be increased each time a read operation is performed for the memory blocks BK0 to BK7.

The read count RD_CNT may not be increased when a read sequence of a memory block which is currently read is later than a read sequence of a memory block which has been previously finally read in a sequential read sequence (i.e., when the read sequences are in sequence). The read count RD_CNT may be increased when a read sequence of a memory block which is currently read is earlier than a read sequence of a memory block which has been previously finally read in the sequential read sequence, or when a memory block which is currently read and a memory block which has been previously finally read correspond (i.e., when the read sequences are out of sequence). Therefore, the read count RD_CNT may be increased when the shaded processed read operations RD0, RD8 and RD16 are respectively performed.

As described above, since an influence by read disturbance may be exerted over memory blocks, the block count BK_CNT may most appropriately reflect the influence by read disturbance. For example, when it is necessary to perform a read reclaim operation before a read count RD_CNT in each memory block exceeds "4," so as to effectively recover damage to data owing to the influence by read disturbance, a threshold count for triggering the read reclaim operation may be set to "4." In this case, although the block count BK_CNT may appropriately reflect a timing at which a read reclaim operation should be performed, the block count BK_CNT may serve as a memory overhead of the controller 100A, by the number of memory blocks. Since the group count GR_CNT is a single count per memory group, the group count GR_CNT needs a memory smaller than the block count BK_CNT, but an unnecessary read reclaim operation may be caused as the group count GR_CNT increases significantly. However, since the read count RD_CNT according to the embodiment is not substantially increased when a sequential read operation is performed, the read count RD_CNT may suppress an unnecessary read reclaim operation, and be managed sufficiently with a small memory. Moreover, since the read count RD_CNT is always retained to be higher than the block count BK_CNT, a timing at which a read reclaim operation should be performed may not be overlooked.

Referring to FIG. 3B, when only random read operations RD0 to RD7 are successively performed for memory blocks BK0 to BK7, a block count BK_CNT, a group count GR_CNT and a read count RD_CNT may be counted as shown.

A scheme in which the block count BK_CNT and the group count GR_CNT are counted is the same as described above with reference to FIG. 3A.

According to the embodiment, the read count RD_CNT may be increased when the shaded processed read operations RD0, RD2, RD3, RD6 and RD7 are respectively performed.

In summary, when only the random read operations RD0 to RD7 are successively performed for the memory blocks BK0 to BK7, the read count RD_CNT may be managed sufficiently with a smaller memory than the block count BK_CNT, and reflect more appropriately a timing for triggering a read reclaim operation than the group count GR_CNT.

Figure 4:
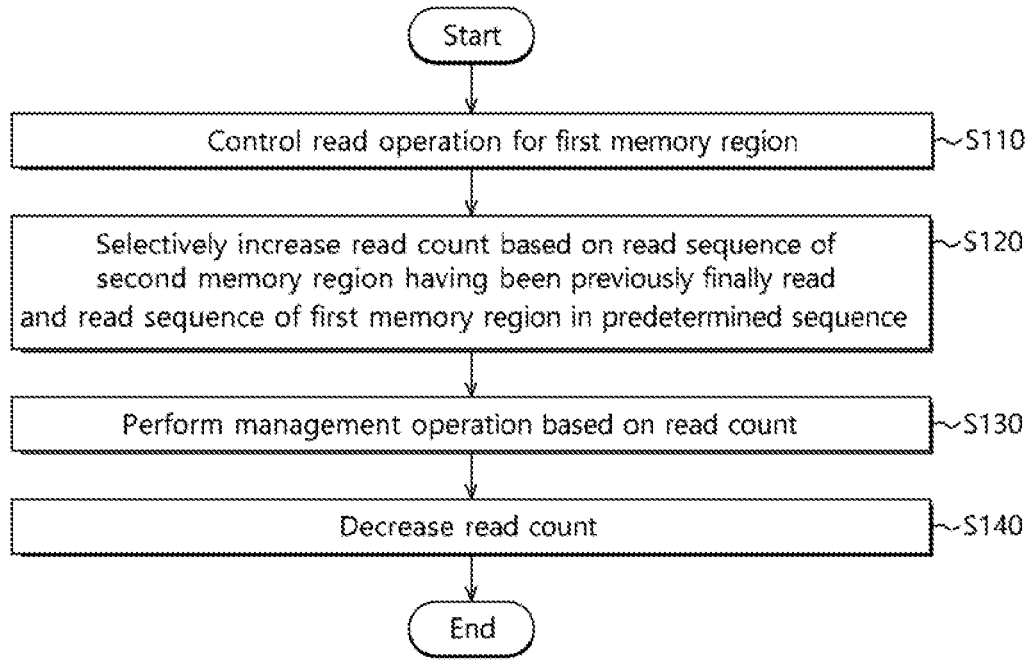
FIG. 4 is a flow chart illustrating a method for operating a data storage device.

FIG. 4 is a flow chart illustrating a method for operating a data storage device. For example, the method of FIG. 4 may be a method for operating the data storage device 10A of FIG. 1, and may be performed by the controller 100A of the data storage device 10A.

At step S110, the controller 100A may control a read operation for a first memory region among a plurality of memory regions which are managed based on a predetermined sequence. The predetermined sequence may be a sequence in which sequential read operations are performed for the plurality of memory regions.

At step S120, the controller 100A may selectively increase a read count RD_CNT based on a read sequence of a second memory region which has been previously finally read and a read sequence of the first memory region in the predetermined sequence. In detail, the controller 100A may not increase the read count RD_CNT when the read sequence of the first memory region is later than the read sequence of the second memory region (i.e., when the read sequences are in sequence). The controller 100A may increase the read count RD_CNT when the read sequence of the first memory region is earlier than the read sequence of the second memory region or when the first memory region corresponds to the second memory region (i.e., when the read sequences are out of sequence). That is, the controller 100A may selectively increase a read count RD_CNT based on numbers of the first and second memory regions in the predetermined sequence. For example, the lowest memory region such as, BK0 in FIGS. 2, 3A and 3B has the minimum number and the greatest memory region such as, BK7 in FIGS. 2, 3A and 3B has the maximum number. If the number of the first memory region which is currently read is greater than the number of the second memory region which has been read previously, the controller 100A may not increase the read count RD_CNT. In contrast, if the number of the first memory region is equal to or less than the number of the second memory region, the controller 100A may increase the read count RD_CNT.

At step S130, the controller 100A may perform a management operation for the plurality of memory regions, based on the read count RD_CNT.

At step S140, the controller 100A may decrease the read count RD_CNT. Since the controller 100A has checked a degree to which data stored in the memory regions are damaged and has recovered seriously damaged data through the management operation, the controller 100A may reset the read count RD_CNT or decrease the read count RD_CNT by a predetermined value to defer a next read reclaim operation.

Figure 5:
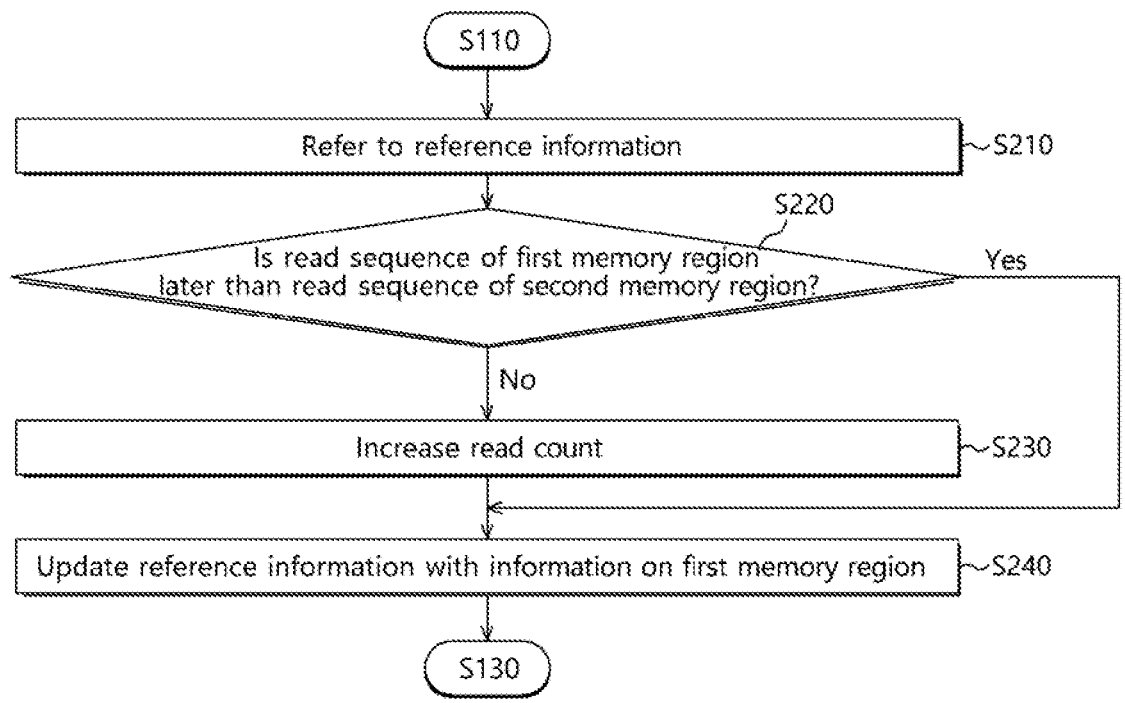
FIG. 5 is a flow chart illustrating a method for a controller to increase a read count.

FIG. 5 is a flow chart illustrating a method for a controller to increase a read count. For example, the method of FIG. 5 may be the method for the controller 100A of FIG. 1 to increase the read count RD_CNT, and may be performed by the controller 100A of the data storage device 10A. The process shown in FIG. 5 may be an example of the step S120 of FIG. 4.

At step S210, the controller 100A may refer to reference information BK_INF. The reference information may be information regarding the second memory region which has been previously finally read.

At step S220, the controller 100A may determine whether the read sequence of the first memory region which is currently read is later than the read sequence of the second memory region. When the read sequence of the first memory region is later than the read sequence of the second memory region, the process may proceed to step S240. When the read sequence of the first memory region is not later than the read sequence of the second memory region, that is, when the read sequence of the first memory region is earlier than or corresponds to the read sequence of the second memory region, the process may proceed to step S230.

At the step S230, the controller 100A may increase the read count RD_CNT.

At the step S240, the controller 100A may update the reference information BK_INF with information regarding the first memory region.

Figure 6:
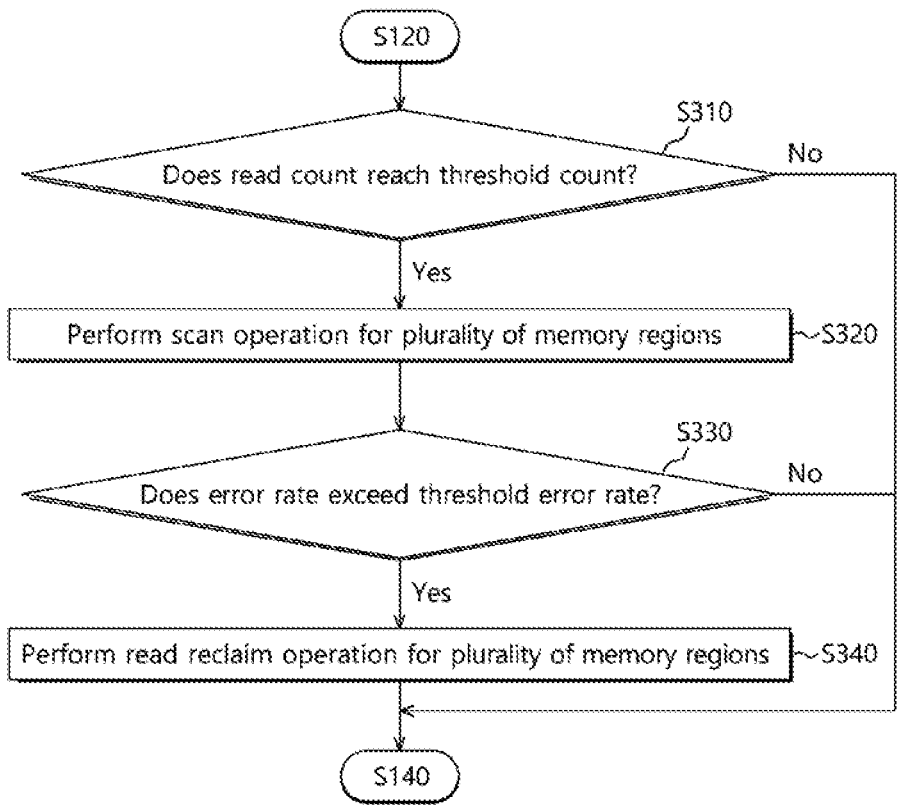
FIG. 6 is a flow chart illustrating a method for a controller to perform a management operation.

FIG. 6 is a flow chart illustrating a method for a controller to perform a management operation. For example, the method of FIG. 6 may be the method for the controller 100A of FIG. 1 to perform the management operation, and may be performed by the controller 100A of the data storage device 10A. The process shown in FIG. 6 may be an example of the step S130 of FIG. 4.

At step S310, the controller 100A may determine whether the read count RD_CNT reaches a threshold count or value. When the read count RD_CNT reaches the threshold count, the process may proceed to step S320. When the read count RD_CNT does not reach the threshold count, the process may proceed to the step S140.

At step S320, the controller 100A may perform a scan operation for the plurality of memory regions. The controller 100A may perform the scan operation by reading data stored in the plurality of memory regions and checking error rates for the data.

At step S330, the controller 100A may determine whether the error rate exceeds a threshold error rate. When the error rate exceeds the threshold error rate, the process may proceed to step S340. When the error rate does not exceed the threshold error rate, the process may proceed to the step S140.

At step S340, the controller 100A may perform a read reclaim operation for the plurality of memory regions. The controller 100A may perform the read reclaim operation by performing an error correction operation for the data read from the plurality of memory regions and storing error-corrected data in other positions.

Figure 7:
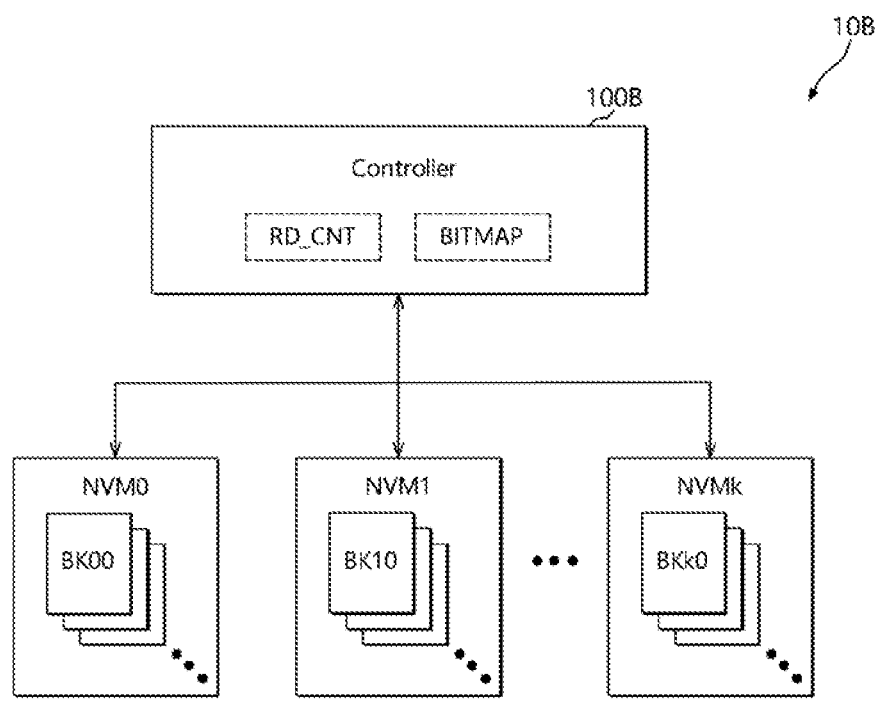
FIG. 7 is a block diagram illustrating a data storage device in accordance with an embodiment.

FIG. 7 is a block diagram illustrating a data storage device 10B in accordance with an embodiment.

The data storage device 10B may include a controller 100B and a plurality of nonvolatile memory devices NVM0 to NVMk.

The controller 100B may control a read operation of a nonvolatile memory device for a first memory region of a memory group, selectively increase a read count RD_CNT based on information regarding one or more second memory regions read during a recent predetermined period, and perform a management operation for the memory group based on the read count RD_CNT. The recent predetermined period may be a period from when the read count RD_CNT has been previously finally increased to now. Additionally, as will be described later, the recent predetermined period may be a period from when a bitmap BITMAP is reset to now. The second memory regions read during the recent predetermined period may include memory regions from a memory region which was read when the read count RD_CNT had been previously finally increased to a memory region which has been previously finally read.

The controller 100B may not increase the read count RD_CNT when the first memory region is not included in the second memory regions. That is, the controller 100B may not increase the read count RD_CNT when the first memory region has not been read during the recent predetermined period. The controller 100B may increase the read count RD_CNT when the first memory region is included in the second memory regions. Furthermore, the controller 100B may increase the read count RD_CNT when the first memory region has been read during the recent predetermined period.

The controller 100B may check a first entry of the currently-read first memory region from a bitmap BITMAP including entries respectively corresponding to a plurality of memory regions. Each of the entries may reflect whether a corresponding memory region has been read during the recent predetermined period. The controller 100B may increase the read count RD_CNT according to a state of the first entry. The controller 100B may reset the bitmap BITMAP when increasing the read count RD_CNT. Further, the controller 100B may update a state of the first entry regardless of whether the read count RD_CNT is increased or not.

The controller 100B may manage the read count RD_CNT and the bitmap BITMAP corresponding to the memory group. The bitmap BITMAP may reflect whether the respective memory regions have been read during the recent predetermined period. When the controller 100B controls a plurality of memory groups, the controller 100B may manage the read count RD_CNT and the bitmap BITMAP corresponding to each of the memory groups. The controller 100B may back up the read count RD_CNT and the bitmap BITMAP in a nonvolatile memory device, and read and manage the read count RD_CNT and the bitmap BITMAP in a nonvolatile memory device as needed for example, upon booting.

The memory regions may be, for example, memory blocks.

The controller 100B may operate in substantially the same manner as the controller 100A of FIG. 1 except the scheme of selectively increasing the read count RD_CNT by referring to the bitmap BITMAP, and therefore, further detailed descriptions thereof will be omitted herein.

According to the embodiment, the read count RD_CNT which triggers the read reclaim operation is managed by the unit of a memory group and is selectively increased with regard to a read operation for a memory group, whereby it is possible to suppress the read reclaim operation from being unnecessarily performed. Furthermore, as will be described later, the read count RD_CNT of FIG. 7 may exhibit improved effectiveness since the read count RD_CNT of FIG. 7 is partially suppressed from being increased in random read operations when compared to the read count RD_CNT of FIG. 1.

Figure 8:
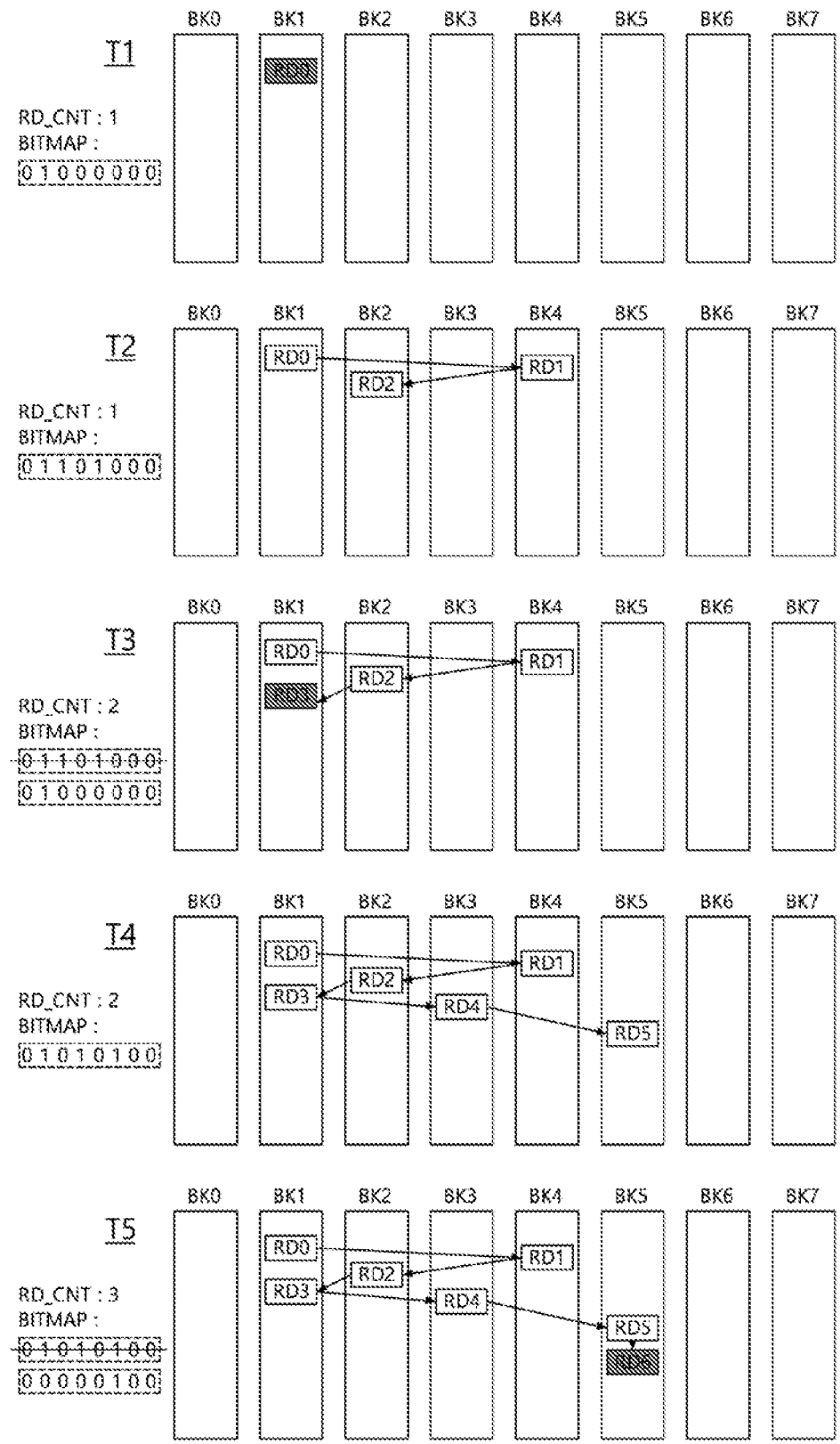
FIG. 8 is a diagram illustrating a method for a controller to manage a read count and a bitmap.

FIG. 8 is a diagram illustrating a method for a controller to manage a read count and a bitmap. For example, the method of FIG. 8 may be the method for the controller 100B of FIG. 7 to manage a read count RD_CNT and a bitmap BITMAP.

When random read operations RD0 to RD6 are performed, the read count RD_CNT may be selectively increased. In FIG. 8, the read count RD_CNT may be increased when the shaded processed read operations RD0, RD3 and RD6 are performed.

First, at a time T1, the controller 100B may control the read operation RD0 for a memory block BK1. The controller 100B may increase the read count RD_CNT to "1," and update a state of an entry corresponding to the memory block BK1 in the bitmap BITMAP as "01000000." The bitmap BITMAP may include entries which sequentially correspond to memory blocks BK0 to BK7, respectively. An entry may store, for example, "0" in a reset state, and be updated to "1" when a corresponding memory region is read.

At a time T2, the controller 100B may control the read operation RD1 for the memory block BK4. The controller 100B may not increase the read count RD_CNT since the memory block BK4 has not been read during a predetermined period, that is, during a period from when the bitmap BITMAP is reset to now. The controller 100B may refer to the bitmap BITMAP to check whether the memory block BK4 has been read. The controller 100B may update a state of an entry corresponding to the memory block BK4 in the bitmap BITMAP as "01001000."

Then, the controller 100B may control the read operation RD2 for the memory block BK2. The controller 100B may check that the memory block BK2 has not been read during the predetermined period, by referring to the bitmap BITMAP, and not increase the read count RD_CNT. The controller 100B may update a state of an entry corresponding to the memory block BK2 in the bitmap BITMAP as "01101000."

At a time T3, the controller 100B may control the read operation RD3 for the memory block BK1. The controller 100B may check that the memory block BK1 has been read during the predetermined period, by referring to the bitmap BITMAP, and increase the read count RD_CNT to "2." The controller 100B may reset the bitmap BITMAP when increasing the read count RD_CNT. The controller 100B may update a state of the entry corresponding to the memory block BK1 in the bitmap BITMAP as "01000000."

At a time T4, the controller 100B may control the read operations RD4 and RD5 for the memory blocks BK3 and BK5, respectively. The controller 100B may check that the memory blocks BK3 and BK5 have not been read during the predetermined period, by referring to the bitmap BITMAP, and may not increase the read count RD_CNT. The controller 100B may update states of entries corresponding to the memory blocks BK3 and BK5 in the bitmap BITMAP to "01010100."

At a time T5, the controller 100B may control the read operation RD6 for the memory block BK5. The controller 100B may check that the memory block BK5 has been read during the predetermined period, by referring to the bitmap BITMAP, and may increase the read count RD_CNT to "3." The controller 100B may reset the bitmap BITMAP when increasing the read count RD_CNT. The controller 100B may update a state of the entry corresponding to the memory block BK5 in the bitmap BITMAP as "00000100."

The read count RD_CNT described above with reference to FIG. 8 may be increased less for the same read operations, when compared to the read count RD_CNT described above with reference to FIG. 3B. That is, the controller 100B of FIG. 7 may exhibit improved effectiveness by increasing less the read count RD_CNT in random read operations, when compared to the controller 100A of FIG. 1.

Figure 9:
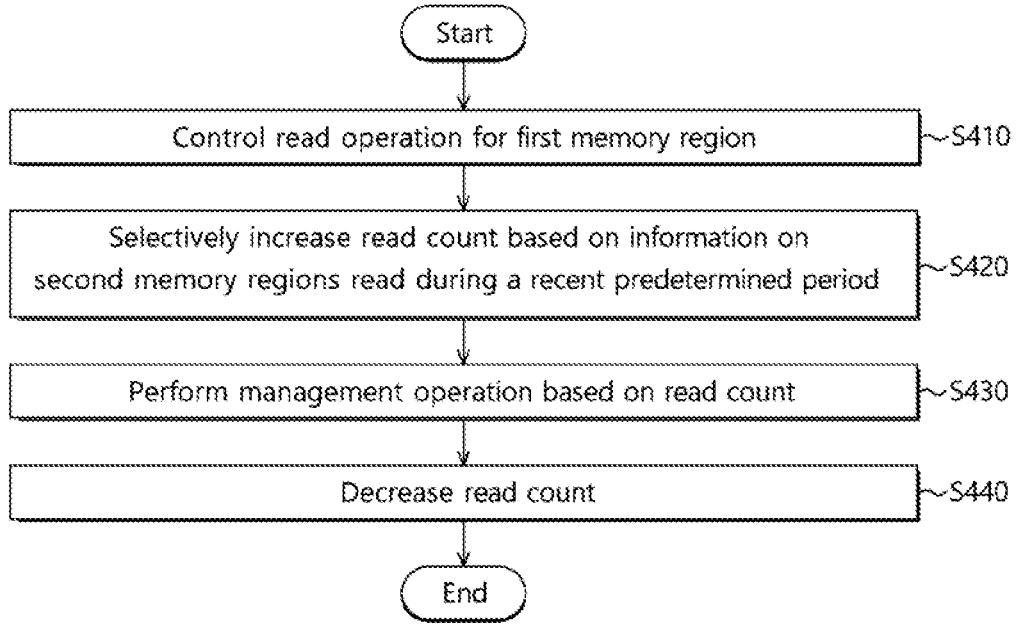
FIG. 9 is a flow chart illustrating a method for operating a data storage device.

FIG. 9 is a flow chart illustrating a method for operating a data storage device. For example, the method of FIG. 9 may be the method for operating the data storage device 10B of FIG. 7, and may be performed by the controller 100B of the data storage device 10B. In the process shown in FIG. 9, steps S410, S430 and S440 may be substantially the same as the steps S110, S130 and S140, respectively, of FIG. 4. Thus, it is noted that descriptions for the steps S410, S430 and S440 will be omitted.

At the step S420, the controller 100B may selectively increase a read count RD_CNT based on information regarding second memory regions which have been read during a recent predetermined period. The recent predetermined period may be a period from when the read count RD_CNT has been previously finally increased to now. The second memory regions read during the recent predetermined period may include memory regions from a memory region which was read when the read count RD_CNT had been previously finally increased to a memory region which has been previously finally read. The controller 100B may not increase the read count RD_CNT when the first memory region is not included in the second memory regions. The controller 100B may increase the read count RD_CNT when the first memory region is included in the second memory regions.

Figure 10:
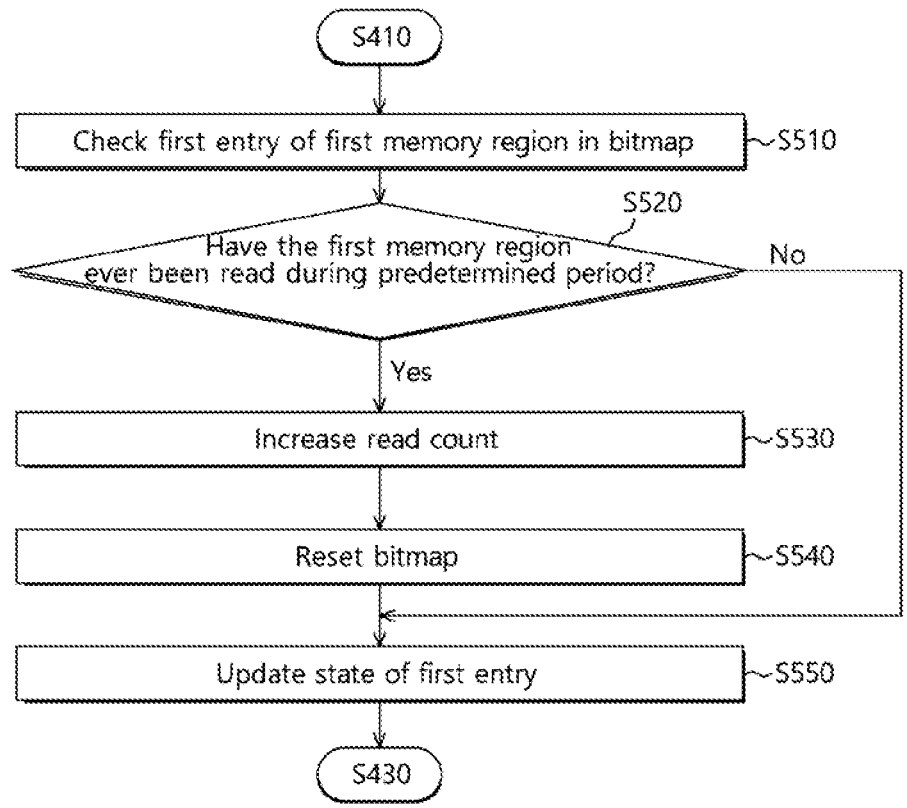
FIG. 10 is a flow chart illustrating a method for a controller to increase a read count.

FIG. 10 is a flow chart illustrating a method for a controller to increase a read count. For example, the method of FIG. 10 may be the method for the controller 100B of FIG. 7 to increase the read count RD_CNT, and may be performed by the controller 100B of the data storage device 10B. The process shown in FIG. 10 may be an example of the step S420 of FIG. 9.

At step S510, the controller 100B may check a first entry of the first memory region in a bitmap BITMAP. The bitmap BITMAP may include entries which respectively correspond to a plurality of memory regions. Each of the entries may reflect whether a corresponding memory region has been read during the recent predetermined period. The recent predetermined period may be a period from when the bitmap BITMAP is reset to now.

At step S520, the controller 100B may determine whether the first memory region has been read during the recent predetermined period, based on the first entry. When the first memory region has been read during the recent predetermined period, the process may proceed to step S530. When the first memory region has not been read during the recent predetermined period, the process may proceed to step S550.

At step S530, the controller 100B may increase the read count RD_CNT.

At step S540, the controller 100B may reset the bitmap BITMAP.

At step S550, the controller 100B may update a state of the first entry.

Figure 11:
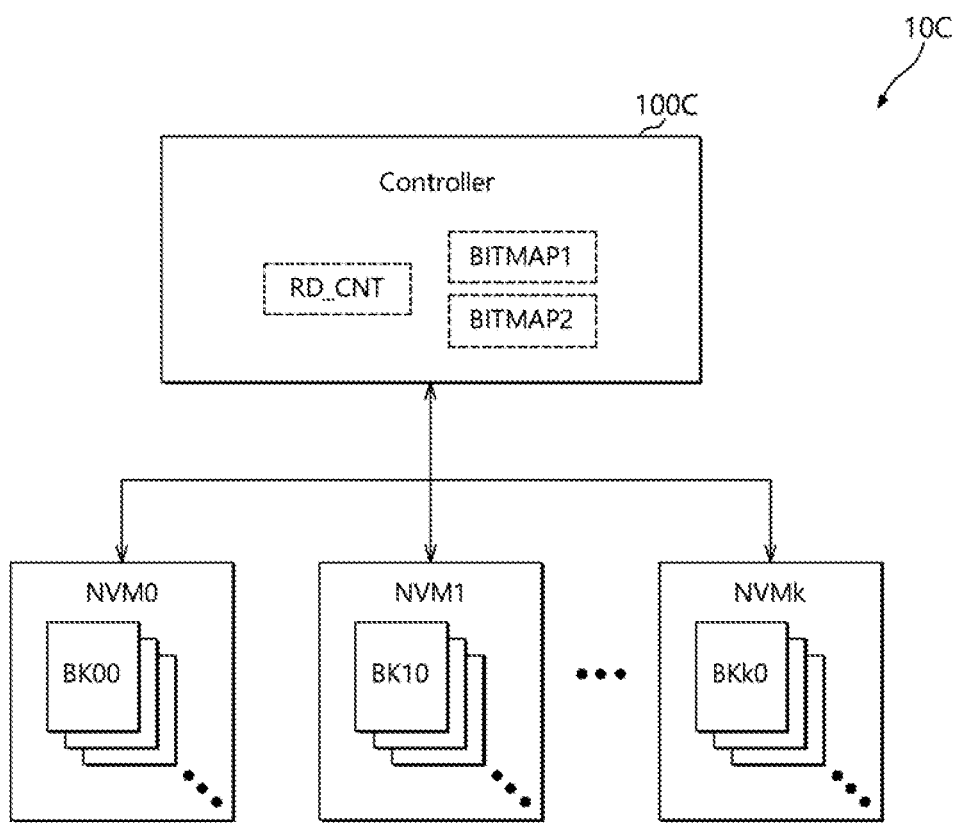
FIG. 11 is a block diagram illustrating a data storage device in accordance with an embodiment.

FIG. 11 is a block diagram illustrating a data storage device 10C in accordance with an embodiment.

The data storage device 10C may include a controller 100C and a plurality of nonvolatile memory devices NVM0 to NVMk including a plurality of memory blocks BK00 to BKk0.

Figure 12:
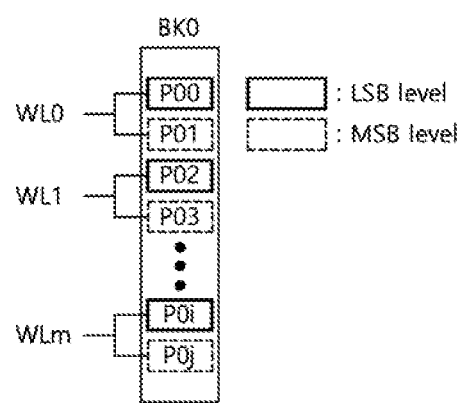
FIG. 12 is a block diagram illustrating the configuration of a memory block in accordance with the embodiment.

FIG. 12 is a block diagram illustrating the configuration of a memory block BK0 in accordance with the embodiment. Each of the memory blocks BK00 to BKk0 of FIG. 11 may be configured in the same way as the memory block BK0 of FIG. 12.

Referring to FIG. 12, the memory block BK0 may include a plurality of memory units P00 to P0j of a Least Significant Bit (LSB) level and a Most Significant Bit (MSB) level. A memory unit may be, for example, a page. The plurality of pages P00 to P0j may be accessed through word lines WL0 to WLm. Each of the word lines WL0 to WLm may be driven to access a corresponding page of the LSB level and a corresponding page of the MSB level among the plurality of pages P00 to P0j. For example, the page P00 of the LSB level and the page P01 of the MSB level may be respectively accessed through the word line WL0.

While not shown, each of the word lines WL0 to WLm may be physically coupled with a plurality of memory cells each of which stores an LSB and an MSB. Therefore, a page of the LSB level and a page of the MSB level corresponding to each word line may correspond to a plurality of memory cells. In detail, a page of the LSB level may be a logical memory unit in which the LSBs of corresponding memory cells are stored. A page of the MSB level may be a logical memory unit in which the MSBs of corresponding memory cells are stored.

FIG. 12 illustrates a case where the pages P00 to P0j have only two levels, that is, the LSB level and the MSB level. However, according to an embodiment, the memory block BK0 may include a plurality of pages of n number of levels. In this case, each of the word lines WL0 to WLm may be driven to access n number of pages of n number of levels. Each of memory cells which are coupled to each word line may store bits of n number of levels.

Figure 13:
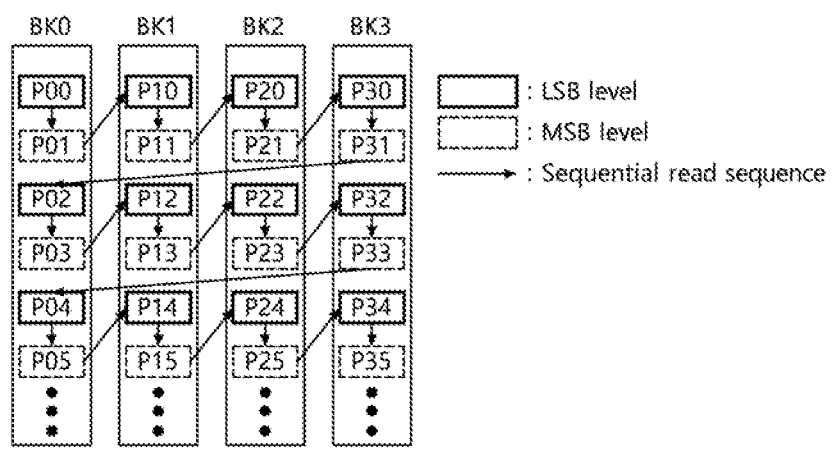
FIG. 13 is a diagram illustrating a sequential read sequence for memory blocks.

FIG. 13 is a diagram illustrating a sequential read sequence for memory blocks BK0 to BK3.

Referring to FIG. 13, first, the memory blocks BK0 to BK3 may be included in different nonvolatile memory devices NVM0 to NVMk of FIG. 11. By the sequential read operations of the controller 100C, pages P00 to P35 included in the memory blocks BK0 to BK3 may be sequentially read according to the sequential read sequence indicated by the arrows. The sequential read sequence may be a sequence in which data are stored in the pages P00 to P35 by the sequential write operations of the controller 100C. As another example, the sequential read sequence may be a sequence in which the successive logical addresses of the data provided from an external host device are mapped to the pages P00 to P35.

When the sequential read operations are performed according to such a sequential read sequence, the controller 100B of FIG. 7 may frequently increase the read count RD_CNT and perform an unnecessary read reclaim operation. According to the above-described operating method of the controller 100B of FIG. 7, the controller 100B may increase the read count RD_CNT at each time of performing a read operation for each of the MSB level pages of the memory blocks BK0 to BK3. That is to say, the read count RD_CNT may be increased to be greater than the number of times by which read operations are actually performed in respective memory blocks.

Referring again to FIG. 11, unlike the controller 100B of FIG. 7, the controller 100C may manage a first bitmap BITMAP1 and a second bitmap BITMAP2. Each of the first bitmap BITMAP1 and the second bitmap BITMAP2 may include a plurality of entries respectively corresponding to the memory blocks of a memory group. The memory group as a unit by which the controller 100C performs a management operation may include memory blocks which are respectively selected in the nonvolatile memory devices NVM0 to NVMk among the memory blocks BK00 to BKk0.

The first bitmap BITMAP1 and the second bitmap BITMAP2 may respectively correspond to the different levels of the pages included in each memory block in the nonvolatile memory devices NVM0 to NVMk. As described above with reference to FIG. 12, when the level of each page is divided into the LSB level and the MSB level, the first bitmap BITMAP1 may correspond to the LSB level and the second bitmap BITMAP2 may correspond to the MSB level, or vice versa.

According to an embodiment, when the level of each page is divided into n number of levels, the controller 100C may manage n number of bitmaps respectively corresponding to the n number of levels.

The controller 100C may control a read operation for, for example, a first page of a first level, in a first memory block among the memory blocks of the memory group. The controller 100C may increase a read count RD_CNT by checking a first entry corresponding to the first memory block, in the first bitmap BITMAP1 corresponding to the first level between the first bitmap BITMAP1 and the second bitmap BITMAP2. Each of the plurality of entries included in the first bitmap BITMAP1 may reflect whether a corresponding memory block is included in at least one second memory block in which a page of the first level has been read, during a predetermined period before the read operation for the first page.

The at least one second memory block may include memory blocks from a memory block which includes a page of the first level read when the read count RD_CNT is previously lastly increased to a memory block which includes a page of the first level previously lastly read.

In detail, the controller 100C may not increase the read count RD_CNT when it is determined by checking the first entry that the first memory block is not included in the at least one second memory block. In other words, the controller 100C may not increase the read count RD_CNT when it is determined by checking the first entry that the first page of the first level in the first memory block has not been read during the predetermined period. Namely, in this case, the read count RD_CNT may not be increased even though the read operation for the first page of the first level is performed.

In detail, the controller 100C may not increase the read count RD_CNT when the first entry is reset. The controller 100C may just update the first entry when not increasing the read count RD_CNT.

Conversely, the controller 100C may increase the read count RD_CNT when it is determined by checking the first entry that the first memory block is included in the at least one second memory block. In other words, the controller 100C may increase the read count RD_CNT when it is determined by checking the first entry that the first page of the first level in the first memory block has been read during the predetermined period.

In detail, the controller 100C may increase the read count RD_CNT when the first entry is updated.

The controller 100C may reset the first bitmap BITMAP1 when increasing the read count RD_CNT depending on the first entry as described above. The controller 100C may update the first entry after resetting the first bitmap BITMAP1.

The controller 100C may perform a management operation for the memory group, based on the read count RD_CNT.

When managing a plurality of memory groups, the controller 100C may manage a read count RD_CNT and bitmaps BITMAP1 and BITMAP2 corresponding to each of the memory groups. The controller 100C may back up the read count RD_CNT and the bitmaps BITMAP1 and BITMAP2 in the nonvolatile memory devices NVM0 to NVMk, and may read and mange them in need, for example, upon booting.

Except for the above-described operating method of the controller 100C, the controller 100C may operate in substantially the same manner as the controller 100A of FIG. 1, and therefore, the other detailed descriptions thereof will be omitted herein.

Figure 14A:
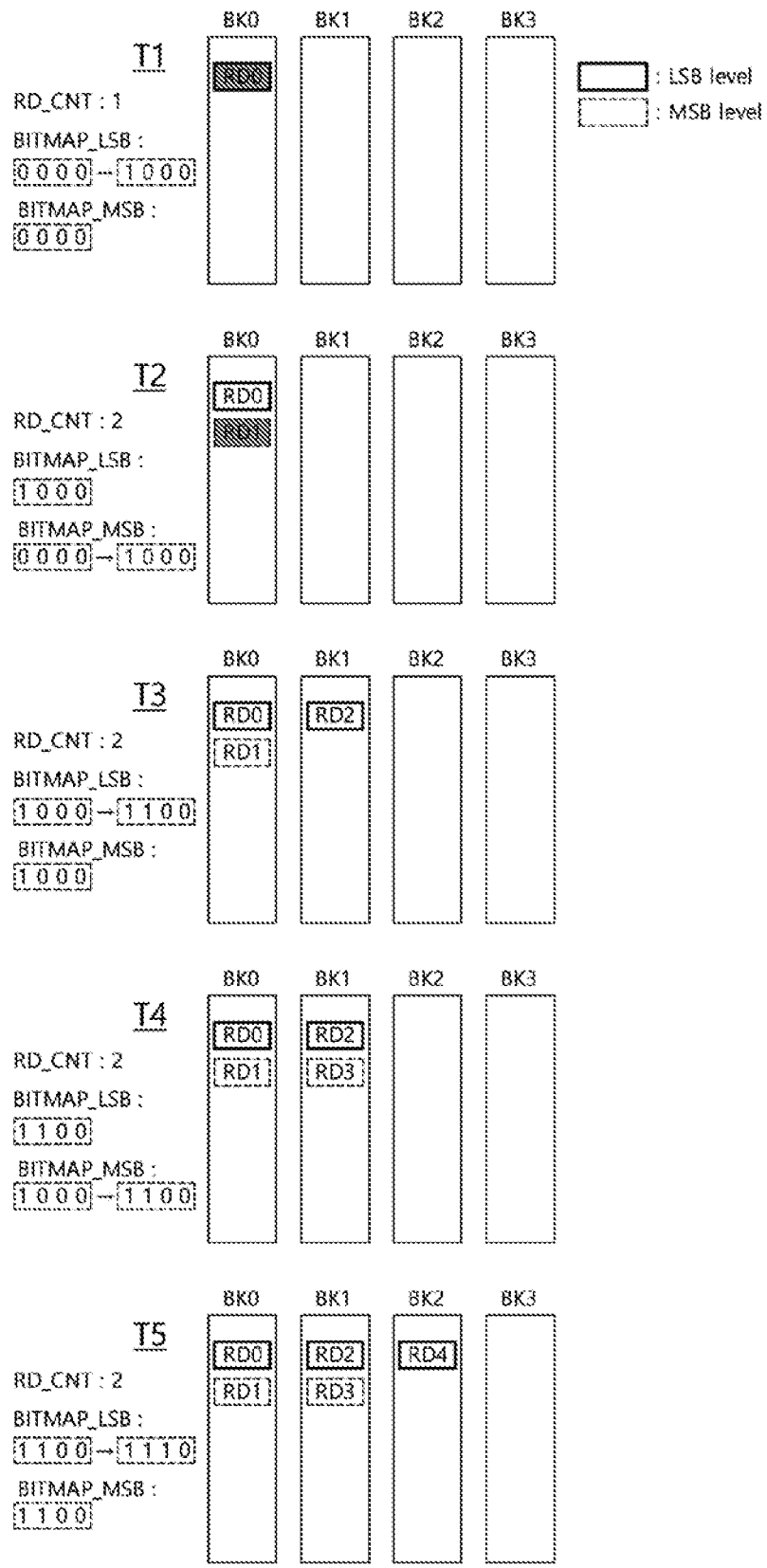
FIGS. 14A and 14B are diagrams to assist in the explanation of a method for the controller of FIG. 11 to manage a read count, an LSB bitmap and an MSB bitmap.
Figure 14B:
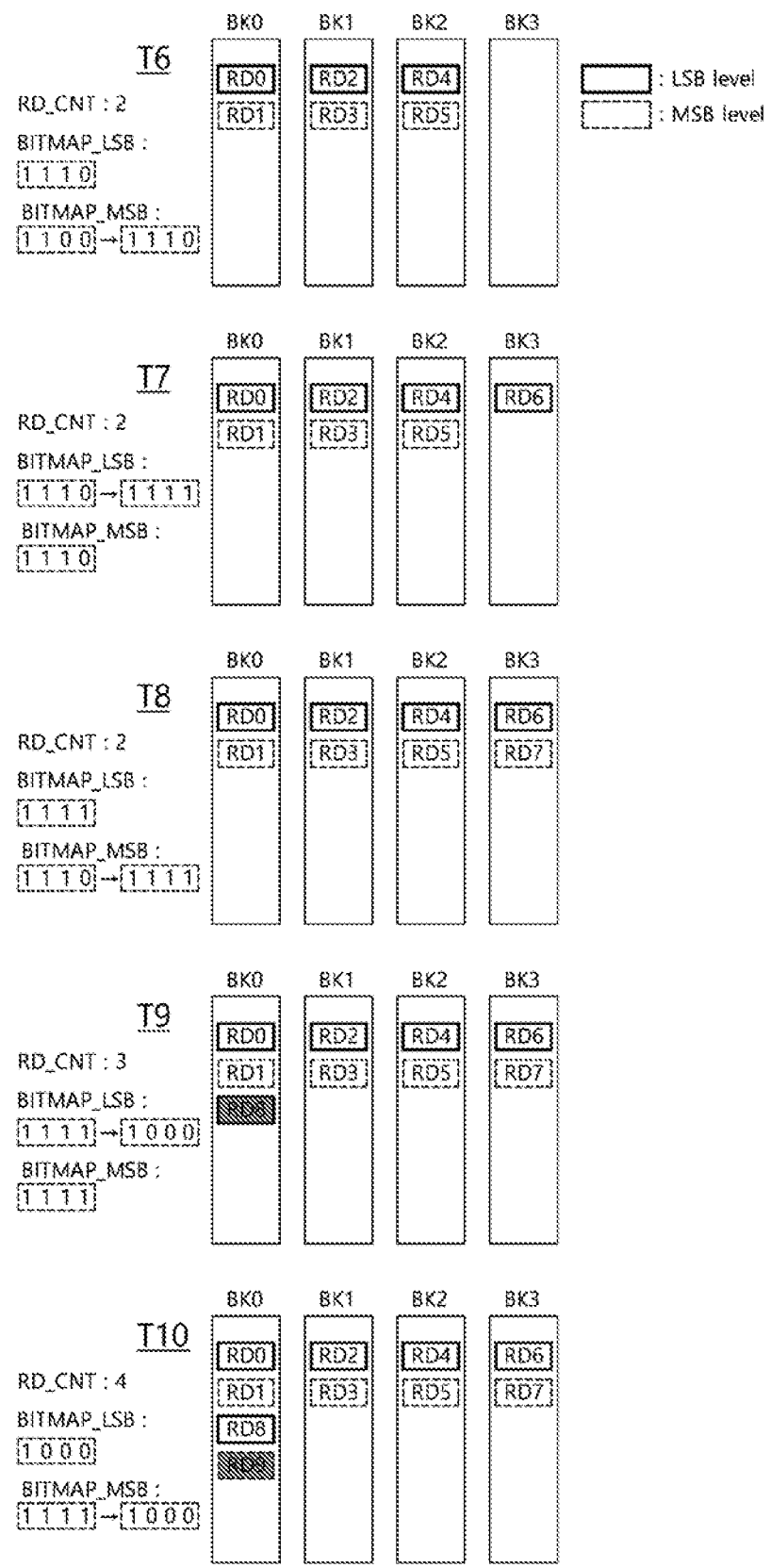

FIGS. 14A and 14B are diagrams to assist in the explanation of a method for the controller 100C of FIG. 11 to manage a read count RD_CNT, an LSB bitmap BITMAP_LSB and an MSB bitmap BITMAP_MSB.

In FIGS. 14A and 14B, sequential read operations RD0 to RD9 may be performed according to the above-described sequential read sequence. While the sequential read operations RD0 to RD9 are performed, the read count RD_CNT may be increased only when some read operations are performed. For example, the read count RD_CNT may be increased only when shaded read operations RD0, RD1, RD8 and RD9 are performed. Therefore, a read reclaim operation to be performed based on the read count RD_CNT may not be performed unnecessarily.

In FIGS. 14A and 14B, each of the LSB bitmap BITMAP_LSB corresponding to the LSB level of pages and the MSB bitmap BITMAP_MSB corresponding to the MSB level of pages may include four entries sequentially and respectively corresponding to memory blocks BK0 to BK3. For example, each entry may be reset to "0" and may be updated to "1" when a corresponding memory block is read.

Referring to FIG. 14A, first, at a time T1, the read operation RD0 for a memory unit of the LSB level in the memory block BK0 may be performed. The controller 100C may increase the read count RD_CNT to "1." That is to say, when an initial read operation for a memory unit of the LSB level is performed in the memory blocks BK0 to BK3, the read count RD_CNT may be increased. The controller 100C may update an entry in the LSB bitmap BITMAP_LSB, corresponding to the memory block BK0 for which the read operation RD0 is performed, to "1."

At a time T2, the read operation RD1 for a memory unit of the MSB level in the memory block BK0 may be performed. The controller 100C may increase the read count RD_CNT to "2." That is to say, when an initial read operation for a memory unit of the MSB level is performed in the memory blocks BK0 to BK3, the read count RD_CNT may be increased. The controller 100C may update an entry in the MSB bitmap BITMAP_MSB, corresponding to the memory block BK0 for which the read operation RD1 is performed, to "1."

At a time T3, the read operation RD2 for a memory unit of the LSB level in the memory block BK1 may be performed. The controller 100C may confirm that a read operation for a memory unit of the LSB level in the memory block BK1 has not been performed during a predetermined period, by checking that an entry corresponding to the memory block BK1 in the LSB bitmap BITMAP_LSB is "0." Therefore, the controller 100C may not increase the read count RD_CNT. The controller 100C may update the entry in the LSB bitmap BITMAP_LSB, corresponding to the memory block BK1 for which the read operation RD2 is performed, to "1."

At a time T4, the read operation RD3 for a memory unit of the MSB level in the memory block BK1 may be performed. The controller 100C may confirm that a read operation for a memory unit of the MSB level in the memory block BK1 has not been performed during a predetermined period, by checking that an entry corresponding to the memory block BK1 in the MSB bitmap BITMAP_MSB is "0." Therefore, the controller 100C may not increase the read count RD_CNT. The controller 100C may update the entry in the MSB bitmap BITMAP_MSB, corresponding to the memory block BK1 for which the read operation RD3 is performed, to "1."

At a time T5, the read operation RD4 for a memory unit of the LSB level in the memory block BK2 may be performed. The controller 100C may confirm that a read operation for a memory unit of the LSB level in the memory block BK2 has not been performed during a predetermined period, by checking that an entry corresponding to the memory block BK2 in the LSB bitmap BITMAP_LSB is "0." Therefore, the controller 100C may not increase the read count RD_CNT. The controller 100C may update the entry in the LSB bitmap BITMAP_LSB, corresponding to the memory block BK2 for which the read operation RD4 is performed, to "1."

Referring to FIG. 14B, at a time T6, the read operation RD5 for a memory unit of the MSB level in the memory block BK2 may be performed. The controller 100C may confirm that a read operation for a memory unit of the MSB level in the memory block BK2 has not been performed during a predetermined period, by checking that an entry corresponding to the memory block BK2 in the MSB bitmap BITMAP_MSB is "0." Therefore, the controller 100C may not increase the read count RD_CNT. The controller 100C may update the entry in the MSB bitmap BITMAP_MSB, corresponding to the memory block BK2 for which the read operation RD5 is performed, to "1."

At a time T7, the read operation RD6 for a memory unit of the LSB level in the memory block BK3 may be performed. The controller 100C may confirm that a read operation for a memory unit of the LSB level in the memory block BK3 has not been performed during a predetermined period, by checking that an entry corresponding to the memory block BK3 in the LSB bitmap BITMAP_LSB is "0." Therefore, the controller 100C may not increase the read count RD_CNT. The controller 100C may update the entry in the LSB bitmap BITMAP_LSB, corresponding to the memory block BK3 for which the read operation RD6 is performed, to "1."

At a time T8, the read operation RD7 for a memory unit of the MSB level in the memory block BK3 may be performed. The controller 100C may confirm that a read operation for a memory unit of the MSB level in the memory block BK3 has not been performed during a predetermined period, by checking that an entry corresponding to the memory block BK3 in the MSB bitmap BITMAP_MSB is "0." Therefore, the controller 100C may not increase the read count RD_CNT. The controller 100C may update the entry in the MSB bitmap BITMAP_MSB, corresponding to the memory block BK3 for which the read operation RD7 is performed, to "1."

At a time T9, the read operation RD8 for a memory unit of the LSB level in the memory block BK0 may be performed. The controller 100C may confirm that a read operation for a memory unit of the LSB level in the memory block BK0 has been performed during a predetermined period, by checking that the entry corresponding to the memory block BK0 in the LSB bitmap BITMAP_LSB is "1." Therefore, the controller 100C may increase the read count RD_CNT to "3." The controller 100C may reset the LSB bitmap BITMAP_LSB to "0," and may update the entry in the LSB bitmap BITMAP_LSB, corresponding to the memory block BK0 for which the read operation RD8 is performed, to "1."

At a time T10, the read operation RD9 for a memory unit of the MSB level in the memory block BK0 may be performed. The controller 100C may confirm that a read operation for a memory unit of the MSB level in the memory block BK0 has been performed during a predetermined period, by checking that the entry corresponding to the memory block BK0 in the MSB bitmap BITMAP_MSB is "1." Therefore, the controller 100C may increase the read count RD_CNT to "4." The controller 100C may reset the MSB bitmap BITMAP_MSB to "0," and may update the entry in the MSB bitmap BITMAP_MSB, corresponding to the memory block BK0 for which the read operation RD9 is performed, to "1."

In summary, when sequential read operations are performed, the read count RD_CNT may be increased by the number of times by which read operations are actually performed in the respective memory blocks. Thus, the controller 100C may perform a read reclaim operation at an appropriate time by clearly figuring out data damage timing by read operations, and may suppress an unnecessary read reclaim operation.

Figure 15:
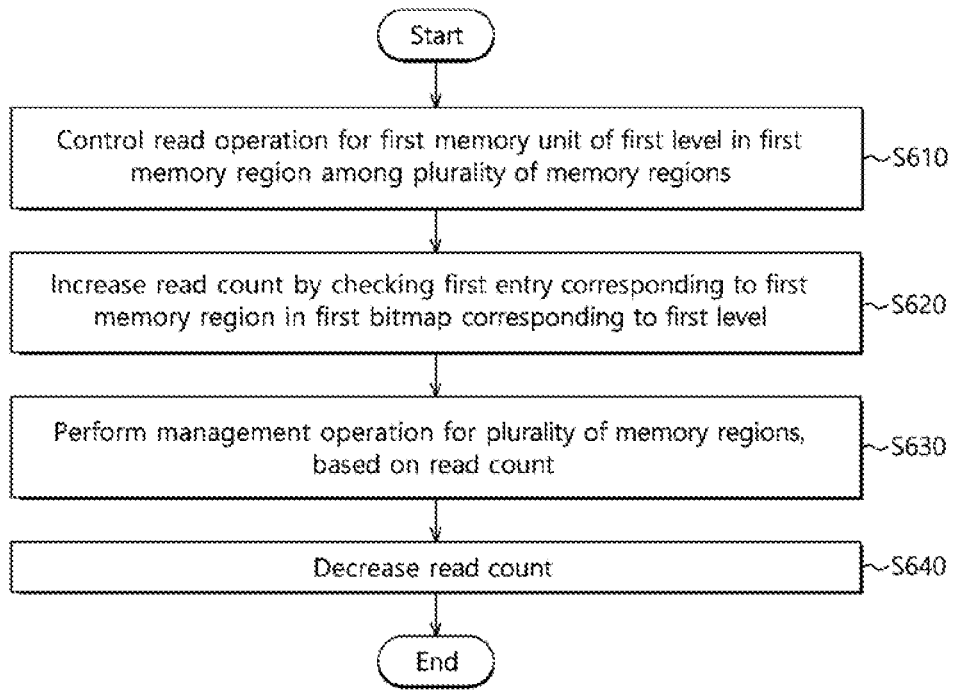
FIG. 15 is a flow chart to assist in the explanation of a method for operating the data storage device of FIG. 11.

FIG. 15 is a flow chart to assist in the explanation of a method for operating the data storage device 10C of FIG. 11. In the process shown in FIG. 15, steps S630 and S640 except steps S610 and S620 may be substantially the same as the steps S130 and S140, respectively, of FIG. 4.

Referring to FIG. 15, at step S610, the controller 100C may control a read operation for a first memory unit of the first level in a first memory region among the memory regions of a memory group.

At step S620, the controller 100C may increase the read count RD_CNT by checking a first entry corresponding to the first memory region, in the first bitmap BITMAP1 corresponding to the first level. Each of the plurality of entries included in the first bitmap BITMAP1 may reflect whether a corresponding memory region is included in at least one second memory region in which a memory unit of the first level has been read, during a predetermined period before the read operation for the first memory unit. The at least one second memory region may include memory regions from a memory region which includes a memory unit of the first level read when the read count RD_CNT is previously lastly increased to a memory region which includes a memory unit of the first level previously lastly read.

Figure 16:
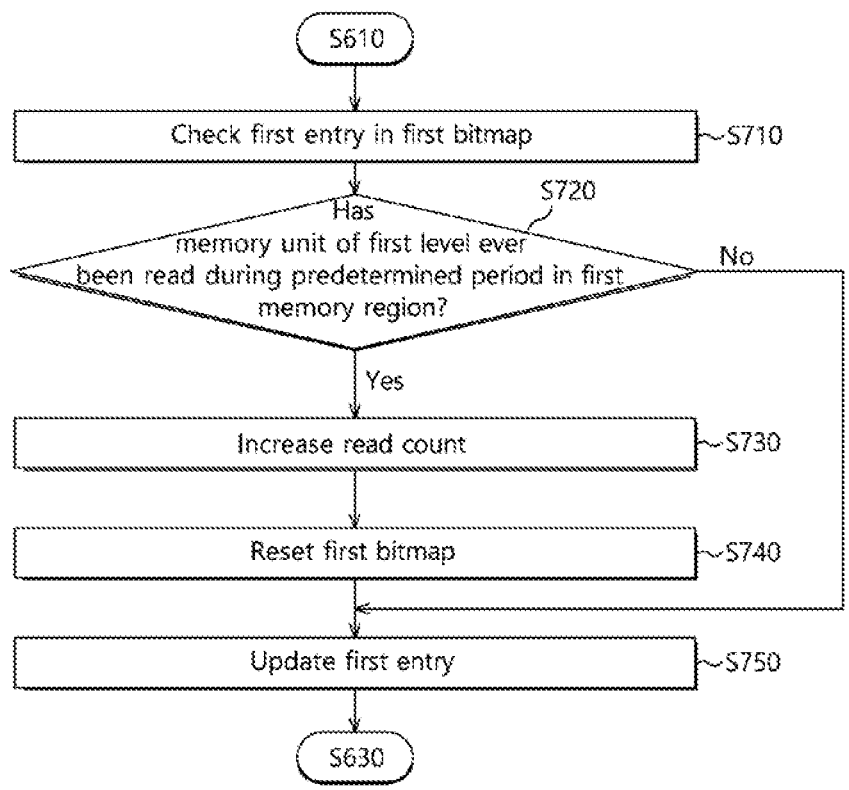
FIG. 16 is a flow chart to assist in the explanation of a method for the controller of FIG. 11 to increase a read count.

FIG. 16 is a flow chart to assist in the explanation of a method for the controller 100C of FIG. 11 to increase the read count RD_CNT. The process shown in FIG. 16 may be an example of the step S620 of FIG. 15.

Referring to FIG. 16, at step S710, the controller 100C may check a first entry corresponding to a first memory region, in the first bitmap BITMAP1.

At step S720, the controller 100C may determine, by checking the first entry, whether a memory unit of the first level in the first memory region has been read during a predetermined period. In other words, the controller 100C may determine, by checking the first entry, that the first memory region is included in at least one second memory region. When the first entry is reset, the controller 100C may determine that a memory unit of the first level in the first memory region has not been read during the predetermined period. When the first entry is updated, the controller 100C may determine that a memory unit of the first level in the first memory region has been read during the predetermined period.

When a memory unit of the first level in the first memory region has been read during the predetermined period, the process may proceed to step S730. When a memory unit of the first level in the first memory region has not been read during the predetermined period, the process may proceed to step S750.

At the step S730, the controller 100C may increase the read count RD_CNT.

At the step S740, the controller 100C may reset the first bitmap BITMAP1.

At the step S750, the controller 100C may update the first entry in the first bitmap BITMAP1.

Figure 17:
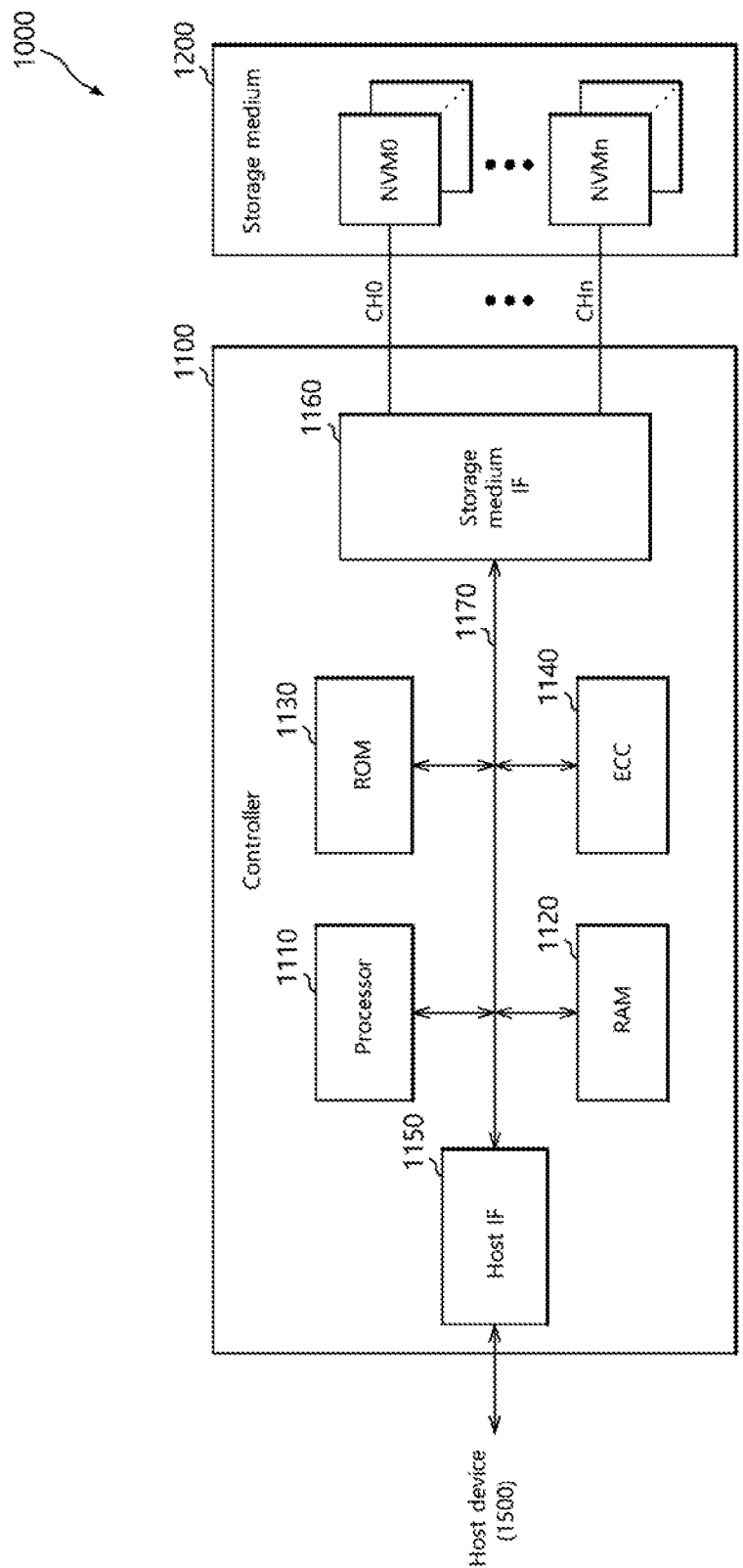
FIG. 17 is a block diagram illustrating a solid state drive (SSD) in accordance with an embodiment.

FIG. 17 is a block diagram illustrating a solid state drive (SSD) 1000 in accordance with an embodiment.

The SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160.

The controller 1100 may operate in a manner substantially similar to the controller 100A shown in FIG. 1.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error which occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to control of the controller 1100.

Figure 18:
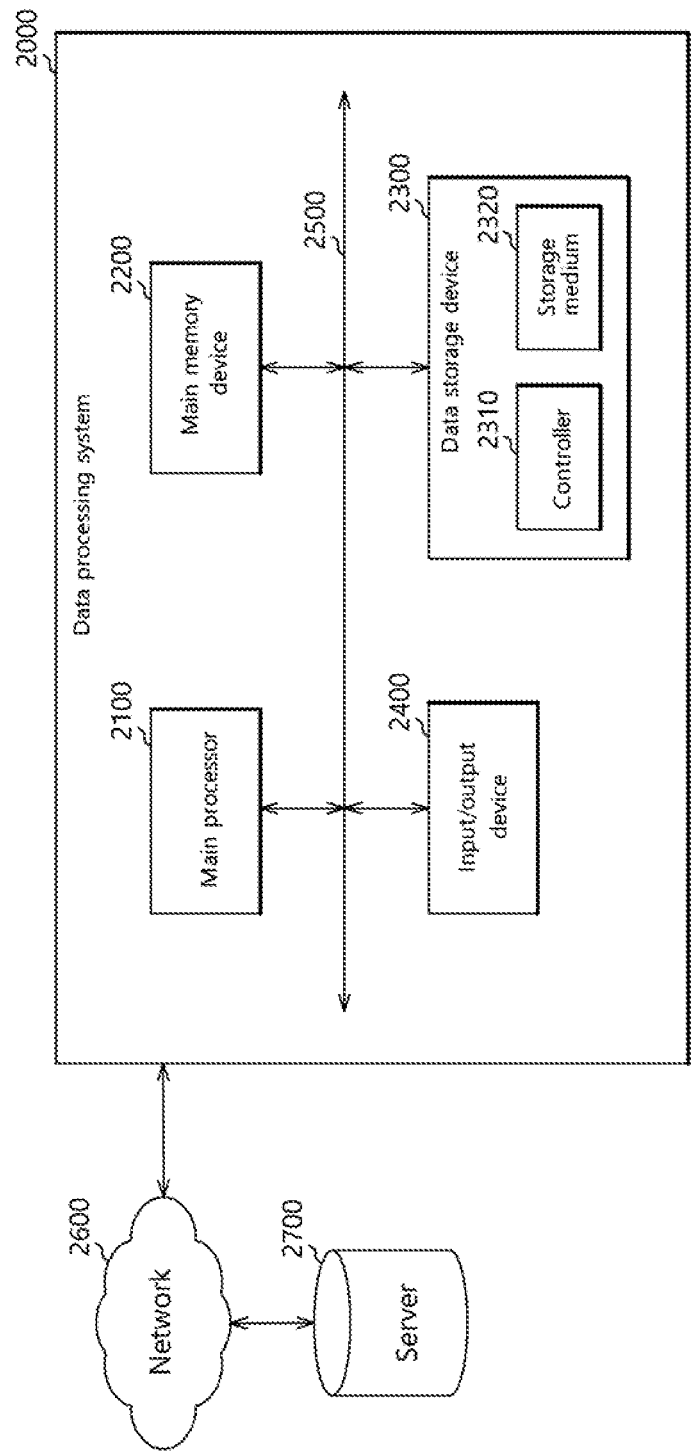
FIG. 18 is a block diagram illustrating a data processing system to which the data storage device in accordance with the embodiment is applied.

FIG. 18 is a block diagram illustrating a data processing system 2000 to which the data storage device 10A in accordance with the embodiment is applied.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit such as a microprocessor. The main processor 2100 may execute software such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on.

The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments.

What is claimed is:

1. A method for operating a data storage device including a plurality of memory regions, each of the plurality of memory regions including memory units of a plurality of levels, the plurality of levels respectively corresponding to a plurality of bitmaps, and each of the bitmaps including a plurality of entries respectively corresponding to the plurality of memory regions, the method comprising:
controlling a read operation for a first memory unit of a first level among the levels in a first memory region among the memory regions;
increasing a read count by checking a first entry corresponding to the first memory region in a first bit map corresponding to the first level among the bitmaps, wherein each of a plurality of entries included in the first bitmap reflects whether a corresponding memory region is included in at least one second memory region in which a memory unit of the first level has been read, during a predetermined period before the read operation for the first memory unit; and
performing a management operation for the plurality of memory regions, based on the read count.

2. The method according to claim 1, wherein the at least one second memory region includes memory regions from a memory region which includes a memory unit of the first level read when the read count is previously lastly increased to a memory region which includes a memory unit of the first level previously lastly read.

3. The method according to claim 1, wherein the increasing of the read count comprises:
not increasing the read count when it is determined by checking the first entry that the first memory region is not included in the at least one second region.

4. The method according to claim 1, wherein the increasing of the read count comprises:
increasing the read count when it is determined by checking the first entry that the first memory region is included in the at least one second region.

5. The method according to claim 1, wherein the increasing of the read count comprises:
not increasing the read count when it is determined by checking the first entry that a memory unit of the first level in the first memory region has not been read during the predetermined period.

6. The method according to claim 1, wherein the increasing of the read count comprises:
increasing the read count when it is determined by checking the first entry that a memory unit of the first level in the first memory region has been read during the predetermined period.

7. The method according to claim 1, wherein the increasing of the read count comprises:
increasing the read count depending on the first entry;
resetting the first bitmap when increasing the read count; and
updating the first entry after resetting the first bitmap.

8. The method according to claim 7, wherein the increasing of the read count depending on the first entry comprises:
not increasing the read count and updating the first entry when the first entry is reset; and
increasing the read count when the first entry is updated.

9. The method according to claim 1, wherein the performing of the management operation comprises:
determining whether the read count reaches a threshold count;
performing a scan operation for the plurality of memory regions, depending on a determination result; and
performing a read reclaim operation for the plurality of memory regions, depending on a result of performing the scan operation.

10. The method according to claim 1, further comprising:
decreasing the read count when the management operation is performed.

11. The method according to claim 1, wherein the plurality of memory regions are respectively included in different nonvolatile memory devices which are included in the data storage device.

12. A data storage device comprising:
a nonvolatile memory device including a plurality of memory regions; and
a controller suitable for performing a read operation for a first memory region, increasing a read count based on read sequences of the first memory region and a second memory region which has been read before the read operation for the first memory region, and performing a management operation for the plurality of memory regions based on the read count,
wherein the controller does not increase the read count when a read sequence of the second memory region and a read sequence of the first memory region are in sequence.

13. The data storage device according to claim 12, wherein the controller compares a read sequence of the second memory region and a read sequence of the first memory region based on a reference information stored for the second memory region, increases the read count according to the comparison result, and updates the reference information with information regarding the first memory region.

14. A data storage device comprising:
a nonvolatile memory device including a plurality of memory regions; and
a controller suitable for performing a read operation for a first memory region, increasing a read count by checking a first entry of the first memory region in a bitmap which includes entries corresponding to the plurality of memory regions respectively, a state of each of the entries reflecting whether a corresponding memory region is included in at least one second memory region which has been read during a predetermined period before the read operation for the first memory region, and performing a management operation for the plurality of memory regions based on the read count.

15. The data storage device according to claim 14, wherein the controller does not increase the read count when the first memory region is not included in the second memory region.

16. The data storage device according to claim 14, wherein the controller increases the read count when the first memory region is included in the second memory region.

17. The data storage device according to claim 14, wherein the second memory region includes memory regions from a memory region which was read when the read count had been previously finally increased to a memory region which has been previously finally read.

18. The data storage device according to claim 14, wherein the controller increases the read count according to a state of the first entry, resets the bitmap when increasing the read count, and updates the state of the first entry.

* * * * *